United States Patent
Lim et al.

(10) Patent No.: US 7,973,368 B2
(45) Date of Patent: Jul. 5, 2011

(54) SEMICONDUCTOR DEVICE WITH T-GATE ELECTRODE

(75) Inventors: Jong Won Lim, Daejeon (KR); Ho Kyun Ahn, Daejeon (KR); Hong Gu Ji, Daejeon (KR); Woo Jin Chang, Daejeon (KR); Jae Kyoung Mun, Daejeon (KR); Hae Cheon Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 141 days.

(21) Appl. No.: 12/122,982

(22) Filed: May 19, 2008

(65) Prior Publication Data

US 2009/0146184 A1   Jun. 11, 2009

(30) Foreign Application Priority Data

Dec. 5, 2007   (KR) .................. 10-2007-0125466

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/369; 257/192; 257/E29.317; 438/172; 438/191

(58) Field of Classification Search ............. 257/192, 257/369, E29.317, E21.403; 438/172, 191
See application file for complete search history.

(56) References Cited

U.S. PATENT DOCUMENTS

| | | | |
|---|---|---|---|
| 6,350,993 B1 * | 2/2002 | Chu et al. ................ | 257/19 |
| 7,045,404 B2 * | 5/2006 | Sheppard et al. .......... | 438/191 |
| 7,494,855 B2 * | 2/2009 | Kikkawa ................... | 438/172 |
| 7,714,360 B2 * | 5/2010 | Otsuka et al. ............. | 257/194 |
| 2006/0226442 A1 * | 10/2006 | Zhang et al. ............... | 257/192 |
| 2007/0128752 A1 | 6/2007 | Shim et al. | |
| 2009/0159930 A1 * | 6/2009 | Smorchkova et al. ...... | 257/194 |

FOREIGN PATENT DOCUMENTS

| JP | 61-216487 A | 9/1986 |
|---|---|---|
| KR | 10-0223021 | 7/1999 |
| KR | 2004-0085688 A | 10/2004 |
| KR | 10-0636597 | 10/2006 |

* cited by examiner

*Primary Examiner* — Phuc T Dang
(74) *Attorney, Agent, or Firm* — Rabin & Berdo, P.C.

(57) ABSTRACT

Provided are a semiconductor device with a T-gate electrode capable of improving stability and a high frequency characteristic of the semiconductor device by reducing source resistance, parasitic capacitance, and gate resistance and a method of fabricating the same. In the semiconductor device, in order to form source and drain electrodes and the T-gate electrode on a substrate, first and second protective layers constructed with silicon oxide layers or silicon nitride layers are formed on sides of a supporting part under a head part of the T-gate electrode, and the second protective layer constructed with a silicon oxide layer or silicon nitride layer is formed on sides of the source and drain electrodes. Accordingly, it is possible to protect an activated region of the semiconductor device and reduce gate-drain parasitic capacitance and gate-source parasitic capacitance.

20 Claims, 34 Drawing Sheets

SEMICONDUCTOR DEVICE WITH T-GATE ELECTRODE

CROSS-REFERENCE TO RELATED APPLICATIONS

This application claims the priority of Korean Patent Application No. 10-2007-0125466 filed on Dec. 5, 2007, in the Korean Intellectual Property Office, the disclosure of which is incorporated herein by reference.

BACKGROUND OF THE INVENTION

1. Field of the Invention

The present invention relates to a semiconductor device with a T-gate electrode capable of improving a noise characteristic by reducing gate resistance and a method of fabricating the same.

The present invention was supported by the IT R&D program of MIC/IITA [2005-S-039-03, SoP for 60 GHz Pico cell Communication].

2. Description of the Related Art

In a pseudomorphic high electron mobility transistor (PHEMT) that is a compound semiconductor device, one or more layers have lattice constants that are considerably different from those of other materials in the compound semiconductor device, and an operation speed is improved by increasing mobility of electrons in a channel layer due to distortion of stress caused by this mismatch of lattice.

In the PHEMT, it is difficult to grow a substrate. However, since the PHEMT has increased current density that is transmitted to a channel layer and high electron mobility, the PHEMT has high power and improved noise characteristic. Accordingly, the PHEMT can operate in a high frequency. As a result, the PHEMT is widely applied to microwave or millimeter-wave band devices. Specifically, since the PHEMT has advantages such as a low super-high frequency noise characteristic, the PHEMT is an important device used to develop millimeter-wave band circuits and components with high performance for wireless communication or circuits and components for tens of Gbps optical communication. In order to improve a noise characteristic by reducing high modulation operation and high gate resistance, a T-gate or mushroom-gate which has a wide cross section is essentially used for the high speed semiconductor device.

The T-gate or mushroom-gate is generally formed through an electron beam lithography method or a photolithography method. Since low resolution insufficient to form a fine line width of a gate electrode is obtained through the photolithography method, the electron beam lithography method is widely used. In the electron beam lithography method, a double-layered or triple-layered photosensitive layer is used.

FIG. 1 is a cross-sectional view illustrating an example of a T-gate structure fabricated by using an insulation film and a mixed photosensitive film according to a conventional technique.

Referring to FIG. 1, a conventional T-gate structure is obtained by forming an etching stop layer 105 on a gallium arsenide (GaAs) substrate 103, forming a GaAs cap 107 by coating the etching stop layer 105 with GaAs and wet-etching the GaAs coat, forming drain and source electrodes 109a and 109b constructed with a Ti—Pt—Au metal layer on the GaAs cap 107, forming a T-gate electrode 113 on the exposed etching stop layer 105 on which the GaAs cap 107 is not formed, and forming an insulation layer 111 constructed with a silicon nitride film on the drain and source electrodes 109a and 109b.

In this T-gate structure, a length of a base of the T-gate 113 may be increased due to the wet-etching of the GaAs cap layer 107, and a high frequency characteristic may be deteriorated due to an increase of gate-source and gate-drain capacitance.

In addition, since a wet-etching process is performed by using the etching stop layer 105, it is necessary to accurately adjust an etching rate. Since an undercut may be formed due to an etching characteristic in which the wet-etching process is performed in lateral directions not only in depth, source resistance may increase and a gate length may be changed. Accordingly, there occurs a problem in performance of a device.

SUMMARY OF THE INVENTION

The present invention provides a semiconductor device with a T-gate electrode capable of improving stability and a high frequency characteristic of the semiconductor device by reducing source resistance, parasitic capacitance, and gate resistance and a method of fabricating the same.

According to an aspect of the present invention, there is provided a semiconductor device comprising: a substrate; source and drain electrodes formed on the substrate; a T-gate electrode constructed with a supporting part contacting the substrate and a head part having a predetermined cross section which is integrated into the supporting part, the T-gate electrode formed on the substrate; a first protective layer made of an insulating material which is formed on sides of the supporting part of the T-gate electrode; and a second protective layer made of an insulating material which is formed on sides of the source and drain electrodes and sides of the first protective layer.

In the above aspect of the present invention, the first protective layer may be formed on the sides of the supporting part of the T-gate electrode or formed only on a lower part of the supporting part.

In addition, the substrate may be constructed with a semiconductive gallium arsenide (GaAs) layer and an epitaxially grown layer that is grown on the GaAs layer, and the first and second protective layers may be silicon nitride layers or silicon oxide layers.

In addition, the first protective layer may have a thickness ranging from 2000 to 3500 Å or a thickness ranging from 300 to 600 Å.

According to another aspect of the present invention, there is provided a method of fabricating a semiconductor with a T-gate electrode, the method comprising: forming source and drain electrodes on a substrate; forming a first protective layer on the substrate; etching the first protective layer so that the first protective layer has a form of two columns; forming a second protective layer on the entire surface of the substrate, the source and drain electrodes, and the first protective layer; removing the second protective layer except parts of the second protective layer which is formed on the source and drain electrodes and sides of the first protective layer; and forming the T-gate electrode between two columns constructed with the first and second protective layers.

In the above aspect of the present invention, the substrate may be constructed with a semiconductive gallium arsenide (GaAs) layer and an epitaxially grown layer that is grown on the GaAs layer, and the first and second protective layers may be silicon nitride layers or silicon oxide layers.

In addition, the etching of the first protective layer so that the first protective layer has the form of the two columns may comprise: coating an upper surface of the first protective layer with a first photosensitive layer of single-layer for image reversion; baking the first photosensitive layer and exposing a region with a predetermined line width to light; maintaining the first photosensitive layer with a predetermined first line width by an image inversion baking, an entire surface exposure, and a photolithography; exposing the substrate except a part protected by an etching mask by anisotropically dry-etching the first protective layer by using the remaining first photosensitive layer as the etching mask; removing the remaining first photosensitive layer; coating an upper surface of the substrate and the upper surface of the remaining first protective layer with the second photosensitive layer; exposing the first protective layer with a second line width by performing a baking, an electron beam irradiation, and a photolithography with respect to the second photosensitive layer; exposing the substrate by anisotropically etching the exposed region of the first protective layer; and removing the second photosensitive layer.

In addition, the removing of the second protective layer except the parts of the second protective layer which is formed on the source and drain electrodes and the sides of the first protective layer may be performed through a dry etching including a reactive ion etching method.

In addition, the forming the T-gate electrode may comprise: coating an upper surface of the substrate on which the source and drain electrodes and the first and second protective layers are formed with a third photosensitive layer; removing a part of the third photosensitive layer corresponding to a region in which the T-gate electrode is to be formed; recess-etching a part of the substrate corresponding to a region in which the T-gate electrode is to be formed; and depositing a metal for a gate electrode on the recess-etched substrate and removing the third photosensitive layer and a metal layer deposited on the third photosensitive layer.

In addition, the forming the T-gate electrode may comprise: forming a double-layered or triple-layered electron beam resist on the substrate and removing a part of the electron beam resist in which a supporting part of the T-gate electrode between the two columns of the first protective layer and a head part on the supporting part are to be formed; recess-etching a part of the substrate between the two columns of the first protective layer which is exposed by removing the electron beam resist through a dry etching; and depositing a metal for a gate electrode on the recess-etched substrate and removing the double-layered or triple-layered electron beam resist and a metal layer deposited on the electron beam resist.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
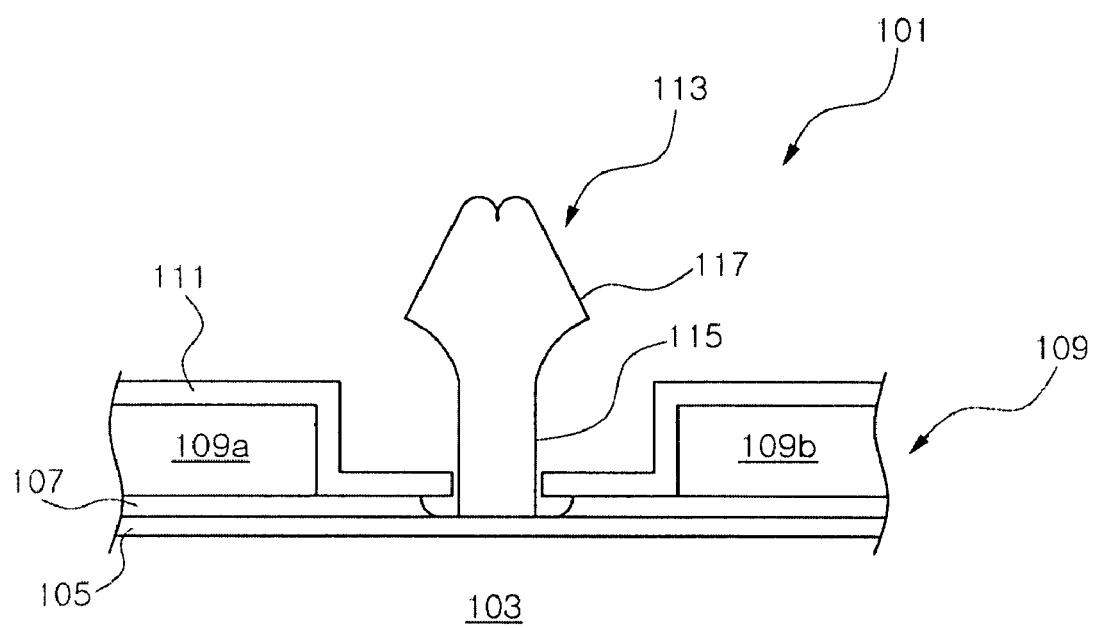
FIG. 1 illustrates a structure of a semiconductor device with a conventional T-gate electrode.

Exemplary embodiments of the present invention will now be described in detail with reference to the accompanying drawings. When it is determined that the detailed descriptions of the known techniques or structures related to the present invention depart from the scope of the invention, the detailed descriptions will be omitted.

Like reference numerals designates like elements throughout the specification.

Embodiment 1

A semiconductor device with a T-gate electrode according to a first embodiment of the present invention is obtained by forming a first protective layer for improving stability of the gate electrode and protecting an activated region of the semiconductor device on sides of the T-gate electrode from a lower end of a head part of the T-gate electrode to a substrate and forming a second protective layer on sides of the first protective layer and sides of source and drain electrodes.

Figure 2A:
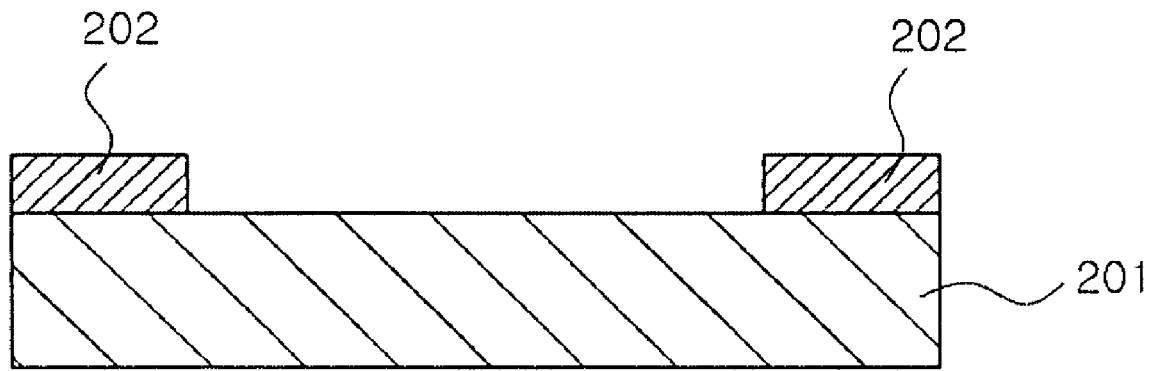
FIGS. 2A to 2N are longitudinal sectional views illustrating processes for fabricating a semiconductor device with a T-gate electrode according to a first embodiment of the present invention and a structure of the semiconductor device.
Figure 2B:
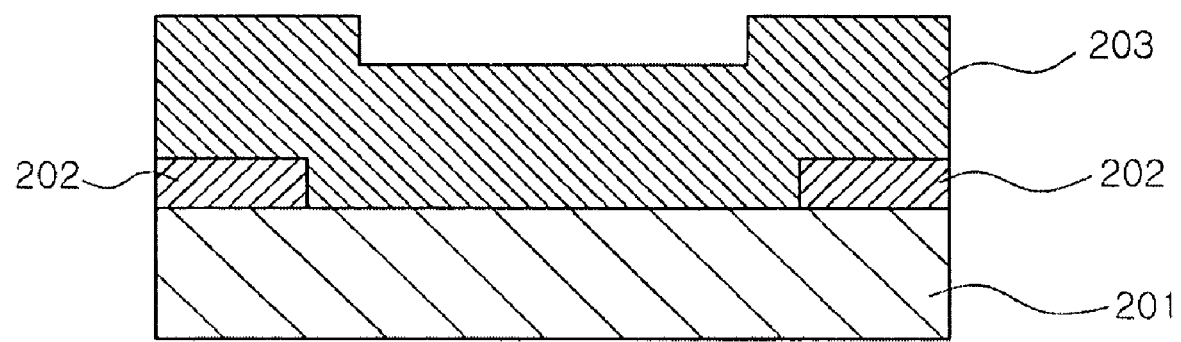
Figure 2C:
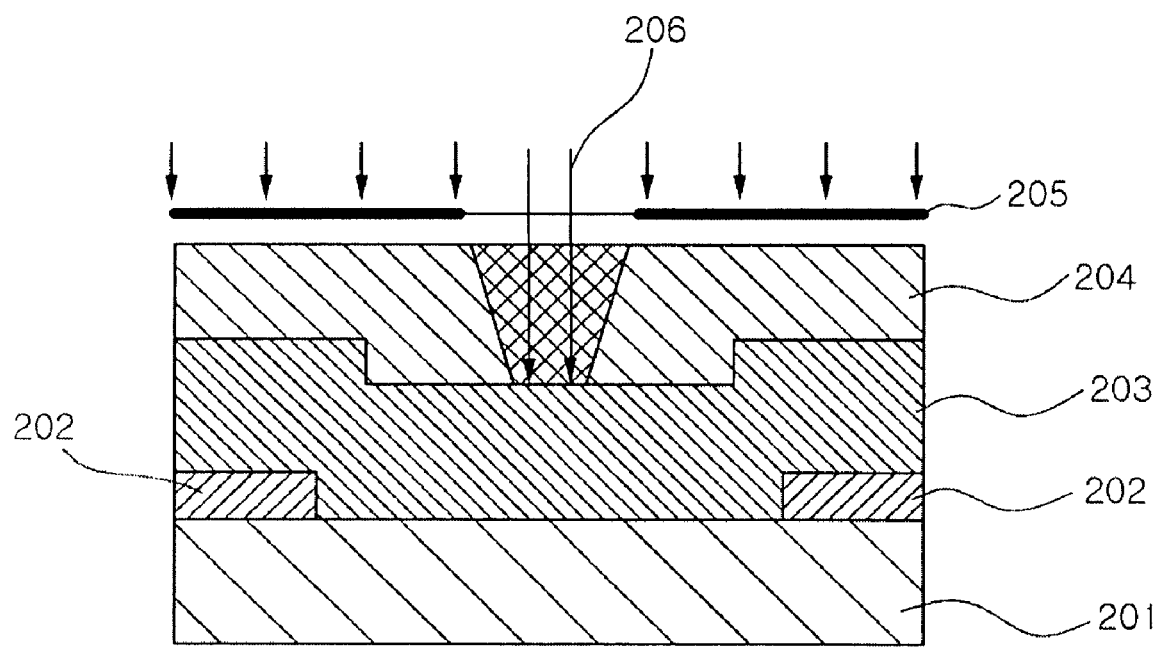
Figure 2D:
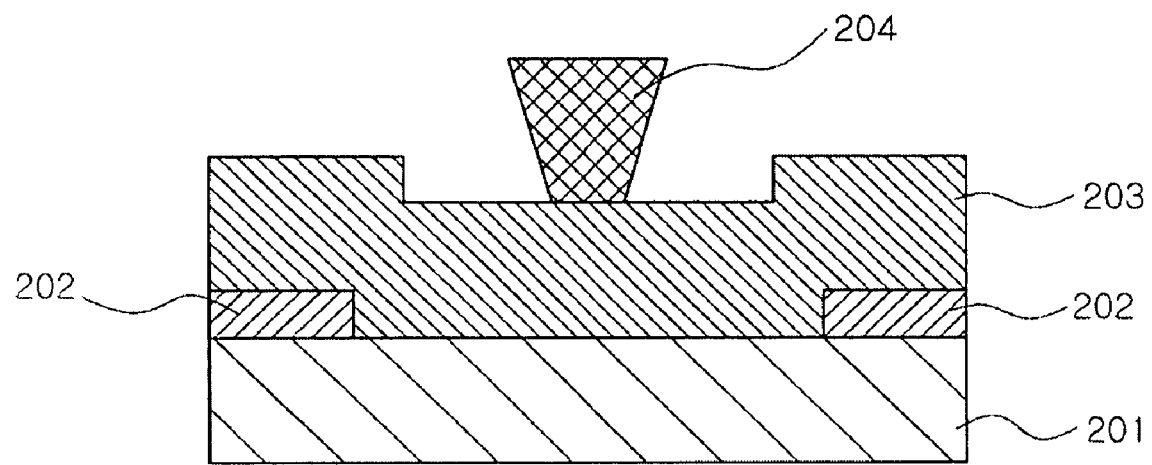
Figure 2E:
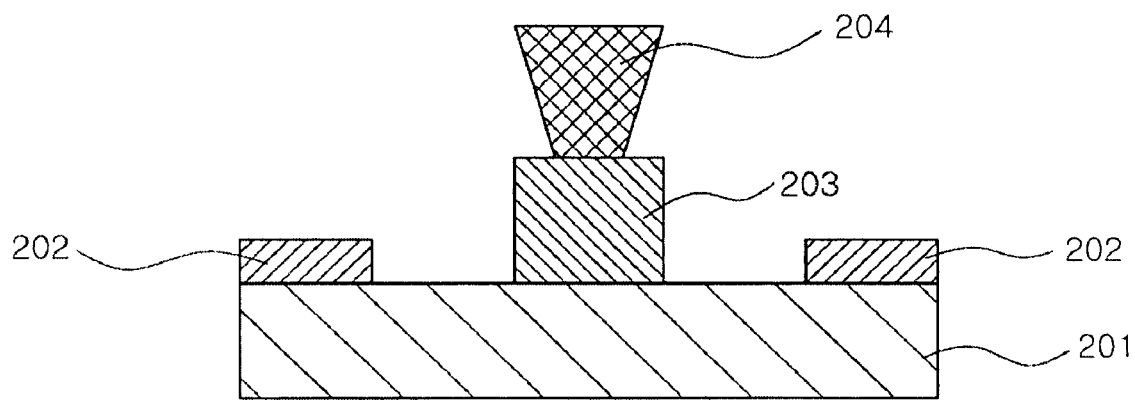
Figure 2F:
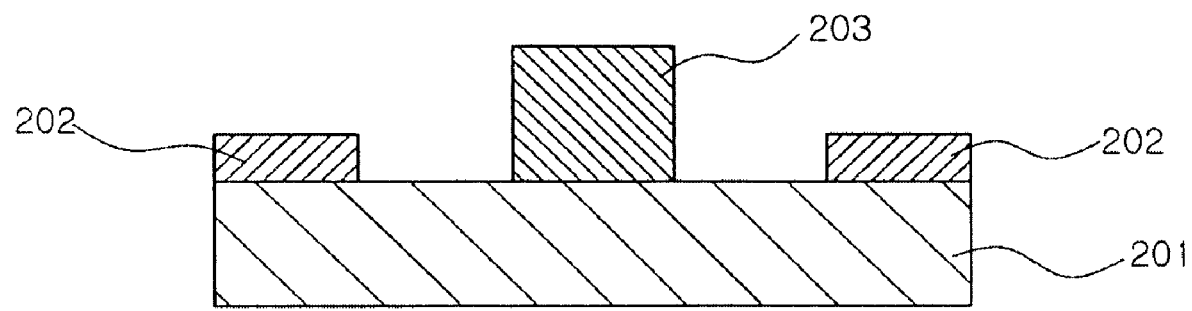
Figure 2G:
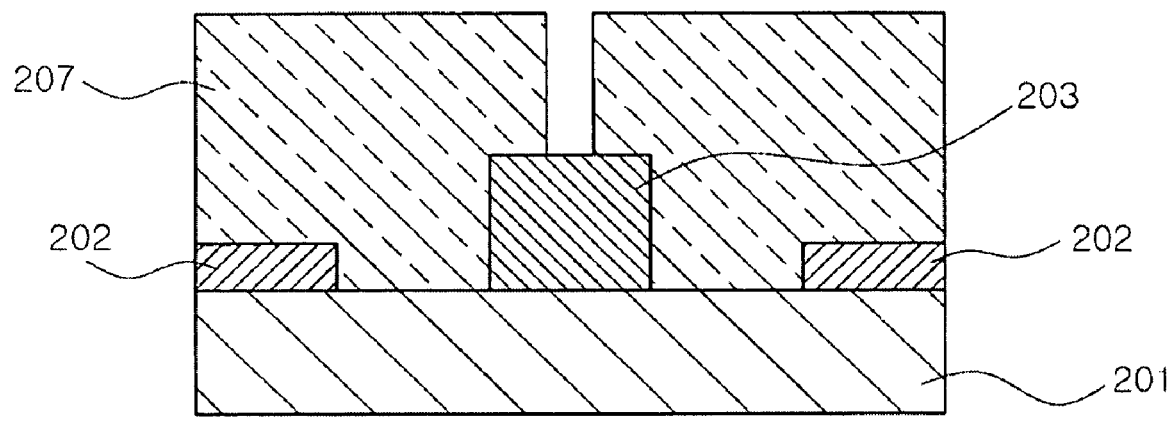
Figure 2H:
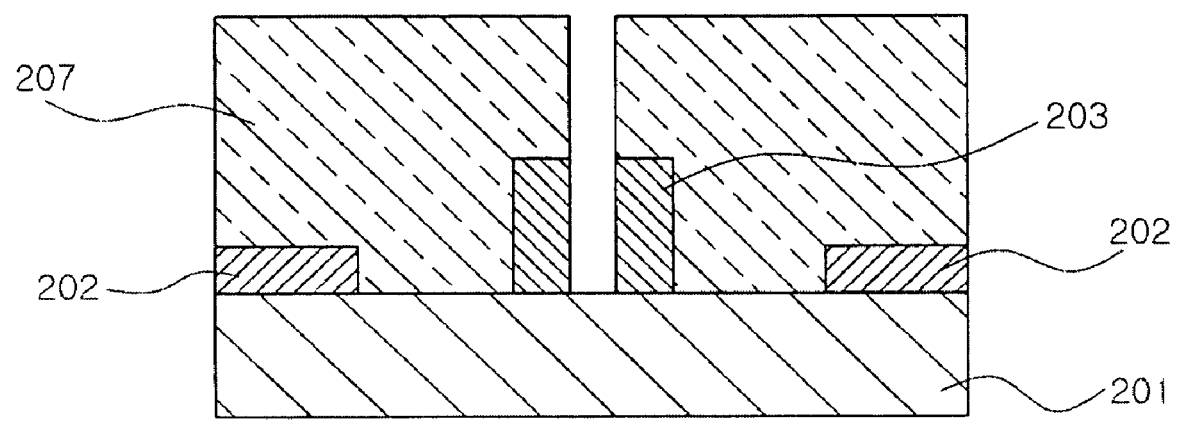
Figure 21:
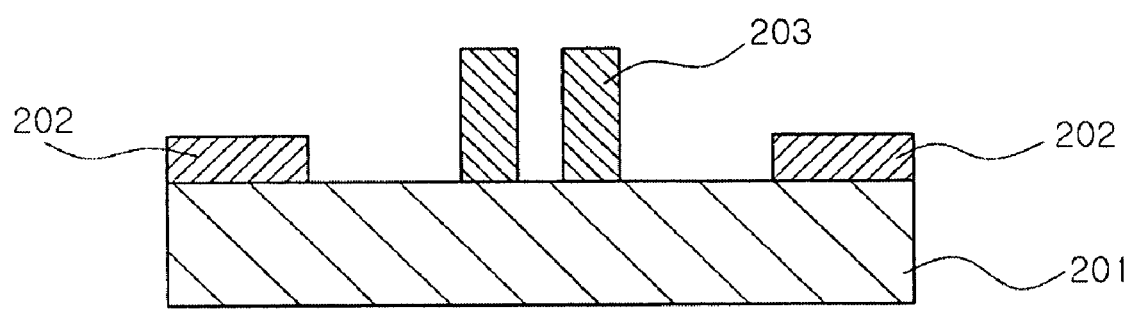
Figure 2J:
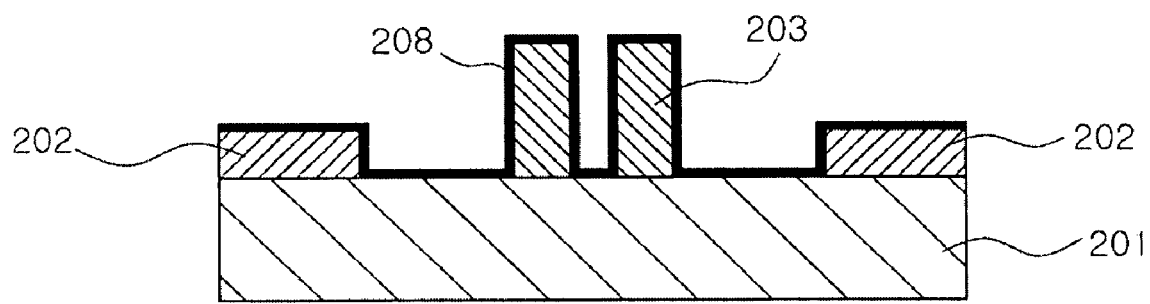
Figure 2K:
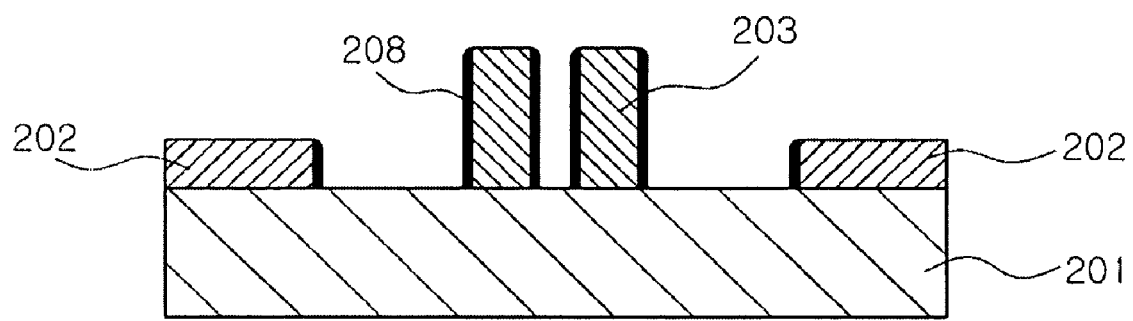
Figure 2L:
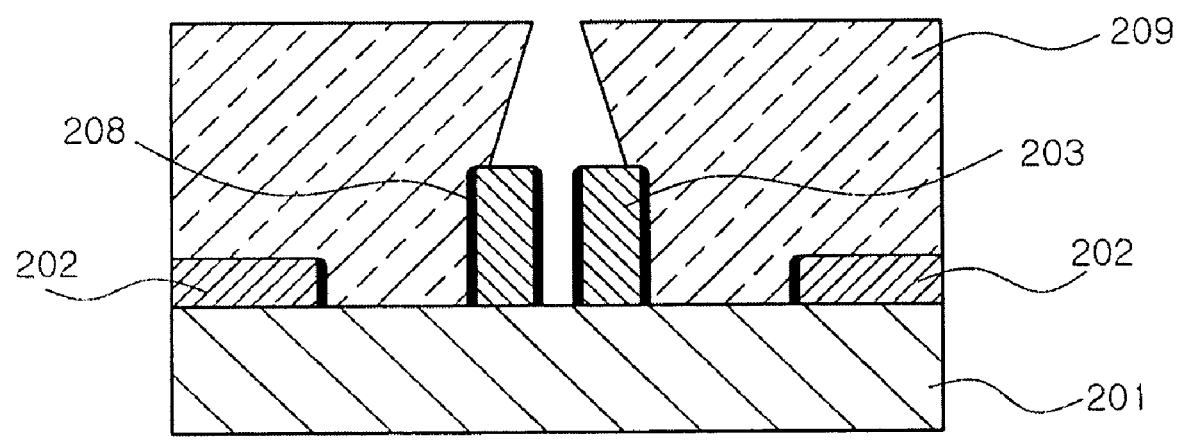
Figure 2M:
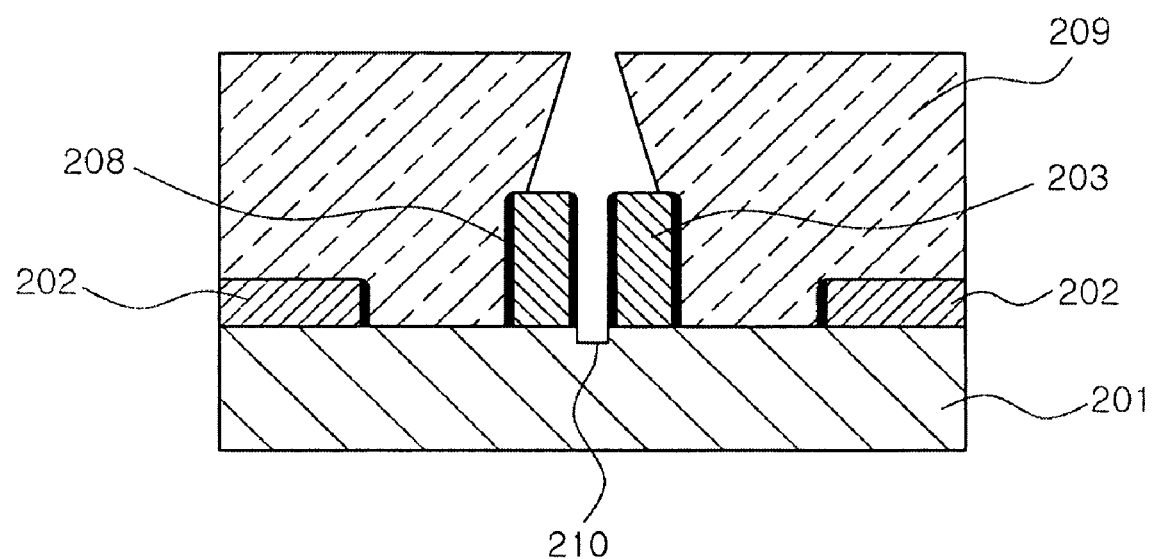
Figure 2N:
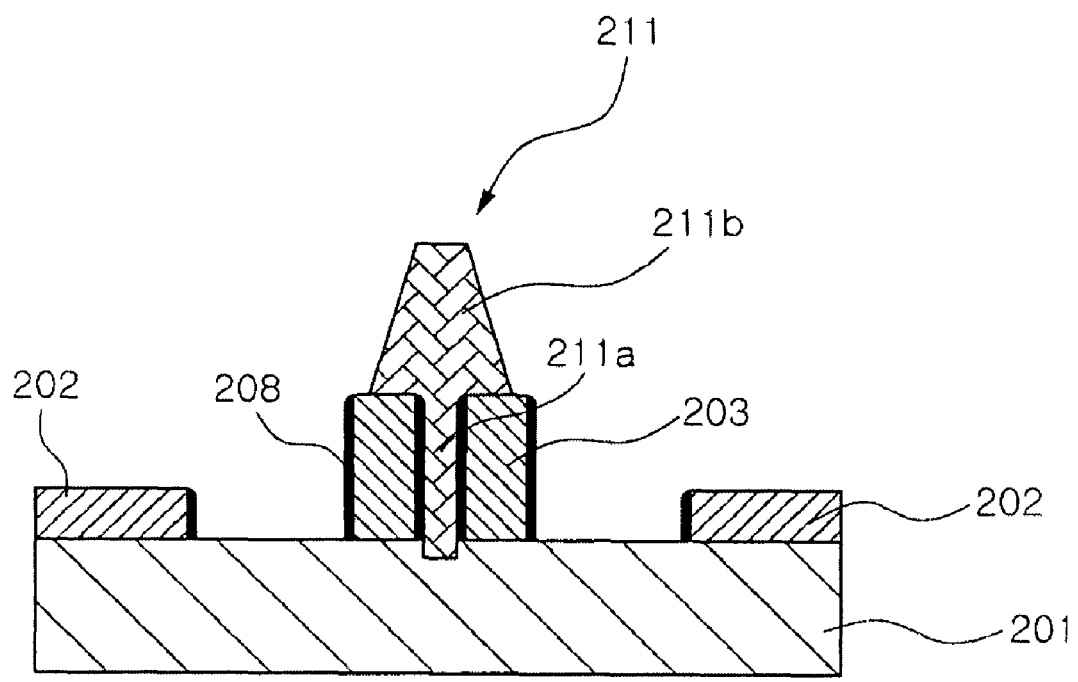

FIGS. 2A to 2N are longitudinal sectional views illustrating a method of fabricating a semiconductor device with a T-gate electrode according to the first embodiment of the present invention and a structure of the semiconductor device. Specifically, FIG. 2N is a longitudinal sectional view illustrating an entire structure of the T-gate electrode according to the first embodiment.

The method of fabricating the semiconductor device with the T-gate electrode according to the first embodiment will be described with reference to FIGS. 2A to 2N.

First, as shown in FIG. 2A, source and drain electrodes 202 are formed on a substrate 201. The substrate 201 is epitaxially grown on a semiconductive gallium arsenide (GaAs) substrate. Then, the source and drain electrodes 202 may be embodied through widely known technology. The source and drain electrodes 202 are made of a conductive metal such as an alloy obtained by processing AuGe/Ni/Au through a rapid thermal process.

As described above, when the source and drain electrodes 202 are formed, a first protective layer for protecting a supporting part of the T-gate electrode is formed on the substrate. Longitudinal sectional views of FIGS. 2B to 2I correspond to a process of fabricating the first protective layer.

Specifically, as shown in FIG. 2B, the first protective layer 203 with a predetermined thickness is deposited on the entire surface of the substrate 201. Here, the first protective layer 203 may be constructed with a silicon nitride layer or silicon oxide layer. In addition, the first protective layer 203 constructed with the silicon oxide layer or silicon nitride layer is deposited through a plasma enhanced chemical vapor deposition (PECVD) method or a sputtering method. At this time, in the first embodiment, the first protective layer 203 is formed on the sides of the T-gate from the lower end of the head part to the substrate so as to reduce gate-drain parasitic capacitance and gate-source parasitic capacitance. The thickness of the first protective layer 203 corresponds to the height of the supporting part of the T-gate. For example, the thickness of the first protective layer 203 ranges from about 2000 to 3500 Å.

Then, as shown in FIG. 2C, the entire surface of the first protective layer 203 is coated with a first photosensitive layer 204 of single-layer. The first photosensitive layer 204 having a thickness ranging from about 1.1 to 1.2 mm is constructed with a photosensitive layer for image inversion. Then, the first photosensitive layer 204 is baked and exposed to light by using a mask 205 with a first line width ranging from 0.8 to 1.2 μm. At this time, ultraviolet rays (I-line, 365 nm) are used as a light source 206.

As shown in FIG. 2D, only the first photosensitive layer 204 with the first line width remains, and the other part is removed by performing an image inversion baking, an entire surface exposure, and a photolithography after exposing the first photosensitive layer 204. Here, temperature and time of the image inversion baking are 113° C. and 3 minutes, respectively.

As shown in FIG. 2E, a part of the first protective layer 203 which is not protected by the remaining first photosensitive layer 204 is anisotropically etched by using the remaining first photosensitive layer 204 as an etching mask. At this time, a dry etching method such as a reactive ion etching method may be used as an etching method. The first protective layer 203 remains only under the remaining photosensitive layer 204. The other part of the first protective layer 203 is removed. Thus, the substrate 201 and the source and drain electrodes 202 are exposed. At this time, the first protective layer 203 may be over-etched so as not to remain on the substrate and the source and drain electrodes 202.

As shown in FIG. 2F, the first protective layer 203 with a desired size is formed by removing the remaining first photosensitive layer 204. At this time, a plasma ashing process may be performed so that the first photosensitive layer 204 may not remain. The first protective layer 203 shown in FIG. 2F has a first line width ranging from about 0.8 to 1.2 μm.

As shown in FIG. 2G, the substrate 201, the source and drain electrodes 202, and the remaining first protective layer 203 are coated with a second photosensitive layer 207 of single-layer, baked, exposed to light by using a mask pattern, and photo lithographed, so that a part of the first protective layer 203 to be etched is exposed. The exposed part may have a second line width of about 0.1 μm. At this time, the second photosensitive layer 207 may be made of poly methyl methacrylate (PMMA). The second photosensitive layer 207 may have a thickness ranging from about 4000 Å to 5500 Å.

As shown in FIG. 2H, the substrate 201 is exposed by anisotropically dry-etching the exposed part of the first protective layer 203 by using the second photosensitive layer 207 as the etching mask. Here, a reactive ion etching method may be used as the dry etching method. At this time, the first protective layer 203 may be over-etched so as not to remain on the surface of the exposed substrate 201. However, it is required not to damage a substrate channel layer. Since this condition is generally known, detailed description on this condition will be omitted.

As shown in FIG. 2I, the second photosensitive layer 207 is removed. Similarly, the plasma ashing process may be performed so that the second photosensitive layer 207 may not remain.

According to the aforementioned processes, the first protective layer 203 has a shape of two columns facing each other at an interval of about 1 μm.

Then, a second protective layer 208 is formed on sides of the source and drain electrodes 202 and sides of the first protective layer 203. This process will be described with reference to FIGS. 2J to 2K. That is, as shown in FIG. 2J, the second protective layer 208 is deposited on the entire exposed surface of the substrate 201, the source and drain electrodes 202, and the first protective layer 203, after the first protective layer 203 with the shape of two columns is formed. At this time, the deposition thickness ranges from about 100 to 250 Å. Like the first protective layer 203, the second protective layer 208 may be constructed with a silicon nitride layer or silicon oxide layer and be deposited through the PECVD method or the sputtering method.

Then, as shown in FIG. 2K, the second protective layer 208 remains on only the sides of the first silicon nitride layer 203 and the sides of the source and drain electrodes 202 by anisotropically etching the second protective layer 208 which is deposited on the upper surface of the substrate 201, the source and drain electrodes 202, and the first protective layer 203 by using the dry etching method such as the reactive ion etching method. At this time, the second protective layer 203 on the substrate 201 that is located between the two columns of the first protective layer 203 is over-etched so that the second protective layer 203 may not remain on the substrate 201.

As described above, when the first and second protective layers 203 and 208 are formed, the T-gate electrode that is supported and protected by the first and second protective layers 203 and 208 is formed. The T-gate electrode is formed through the procedures of FIGS. 2I to 2N.

Specifically, as shown in FIG. 2I, after the upper surface of the substrate 201 is coated with a third photosensitive layer 209, only a part of the third photosensitive layer 209 in which the T-gate electrode is to be formed is removed. More specifically, the T-gate electrode is formed on the substrate 201 that is exposed with a fine line width in the first protective layer 203. At this time, the third photosensitive layer 209 is made of a photosensitive layer for image inversion. The upper surface of the substrate 201 is coated with the third photosensitive layer 209 and baked. A part facing the upper part of the first protective layer 203 with a line width ranging from 0.6 μm to 1.0 μm corresponding to a line width of a head part of the T-gate electrode is exposed to light. The third photosensitive layer 209 of the part with the line width ranging from 0.6 μm to 1.0 μm that is exposed to light is removed by performing an image inversion baking, the entire surface exposure, and the photolithography. Accordingly, an empty space with a T-shape is formed on the first and second protective layers 203 and 208 and between the first two columns of the first and second protective layers 203 and 208. The thickness of the third photosensitive layer 209 is set corresponding to the height of the T-gate, and ranges from 6000 to 7000 Å. Ultraviolet rays (I-line, 365 nm) are used as a light source for the third photosensitive layer 209.

As shown in FIG. 2M, the substrate 201 that is exposed with a fine line width between the two columns of the first protective layer 203 by removing the third photosensitive layer 209 is recess-etched. The recess-etching of the substrate enables a desired current to flow between the source and the drain, thereby adjusting the current. A dry etching method using inductively coupled plasma may be used for the recess etching method. At this time, $BCl_3/SF_6$ is used as a dry etching gas so that only the substrate 201 may be etched except the first and second protective layers 203 and 208 and the third photosensitive layer 209.

As shown in FIG. 2N, a T-gate electrode 211 constructed with a supporting part 211a and a head part 211b is formed by depositing a metal for a gate electrode and removing the third photosensitive layer 209 in a state of FIG. 2M.

Sides of the supporting part 211a of the T-gate electrode 211 are protected by the first and second protective layers 203 and 208. The head part 211b is supported by the supporting part 211a and the first and second protective layers 203 and 208. The T-gate electrode 211 is obtained by depositing the metal for the gate electrode which is Ti/Pt/Au through a vacuum electron beam deposition method. The third photosensitive layer 209 is removed through a lift-off process.

The structure of the semiconductor device with the T-gate according to the first embodiment of the present invention will be described with reference to FIG. 2N.

Referring to FIG. 2N, the semiconductor device with the T-gate according to the first embodiment of the present invention includes the substrate 201, the source and drain electrodes 202 formed on the substrate 201, the T-gate electrode 211 constructed with the supporting part 211a contacting the substrate 201 and the head part 211b with a predetermined cross section which is integrated into the supporting part 211a, the first protective layer 203 made of an insulating material which is formed on sides of the supporting part 211a of the T-gate electrode 211, and the second protective layer 208 made of an insulating material which is formed on sides of the source and drain electrodes 202 and sides of the first protective layer 203.

Since the T-gate electrode 211 is supported and protected stably by the first protective layer 203, the T-gate electrode 211 has the supporting part 211a with a fine line width. In addition, since parasitic capacitance between the T-gate electrode 211 and the source and drain electrodes 202 is decreased due to the first and second protective layers 203 and 208, it is possible to obtain a stable frequency characteristic and a stable operational characteristic.

Embodiment 2

Like the first embodiment, in a semiconductor device with a T-gate electrode according to a second embodiment of the present invention, first and second protective layers and second protective layers for reducing parasitic capacitance and protecting the semiconductor device are formed on sides of a supporting part of the T-gate electrode and sides of source and drain electrodes, respectively, except that the first and second protective layers are formed on lower parts of the supporting part of the T-gate electrode which contacts the substrate instead of entire sides of the supporting part. Accordingly, some processes of fabricating the semiconductor device may be changed.

Figure 3A:
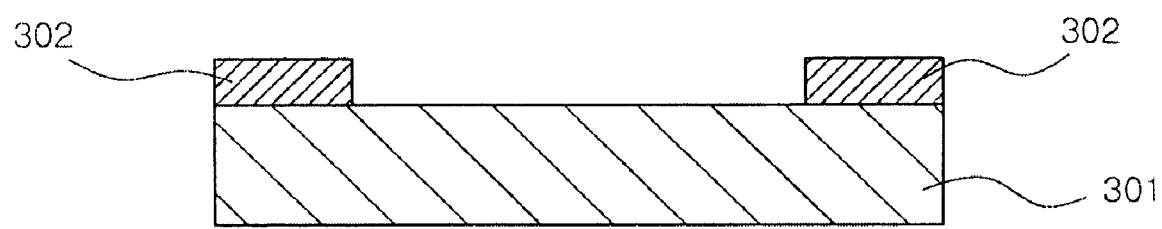
FIGS. 3A to 3P are longitudinal sectional views illustrating processes for fabricating a semiconductor device with T-gate electrode according to a second embodiment of the present invention and a structure of the semiconductor.
Figure 3B:
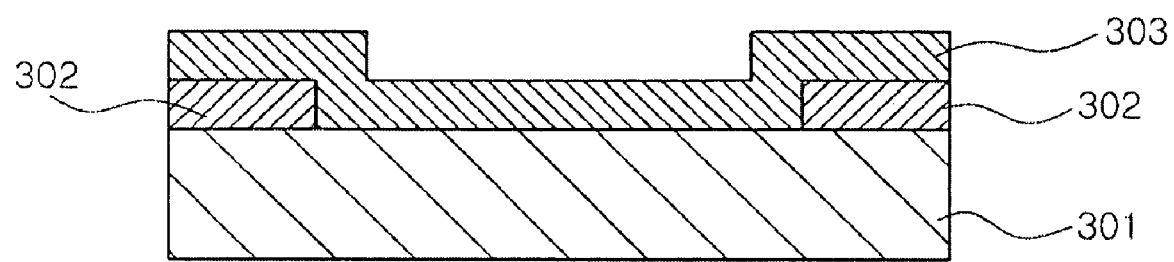
Figure 3C:
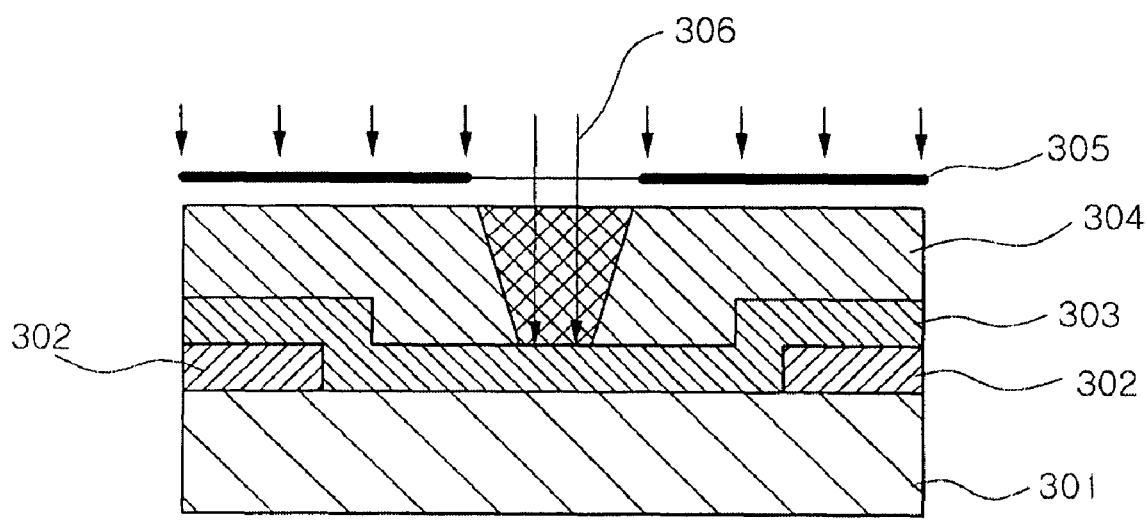
Figure 3D:
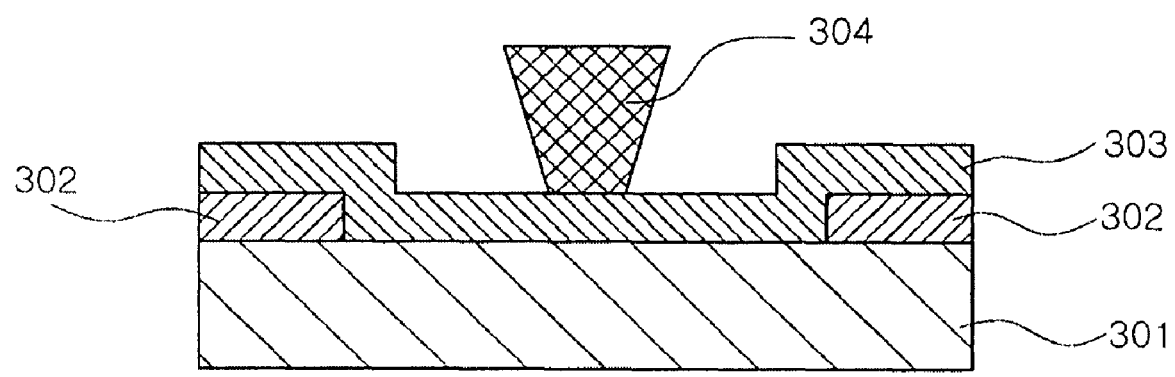
Figure 3E:
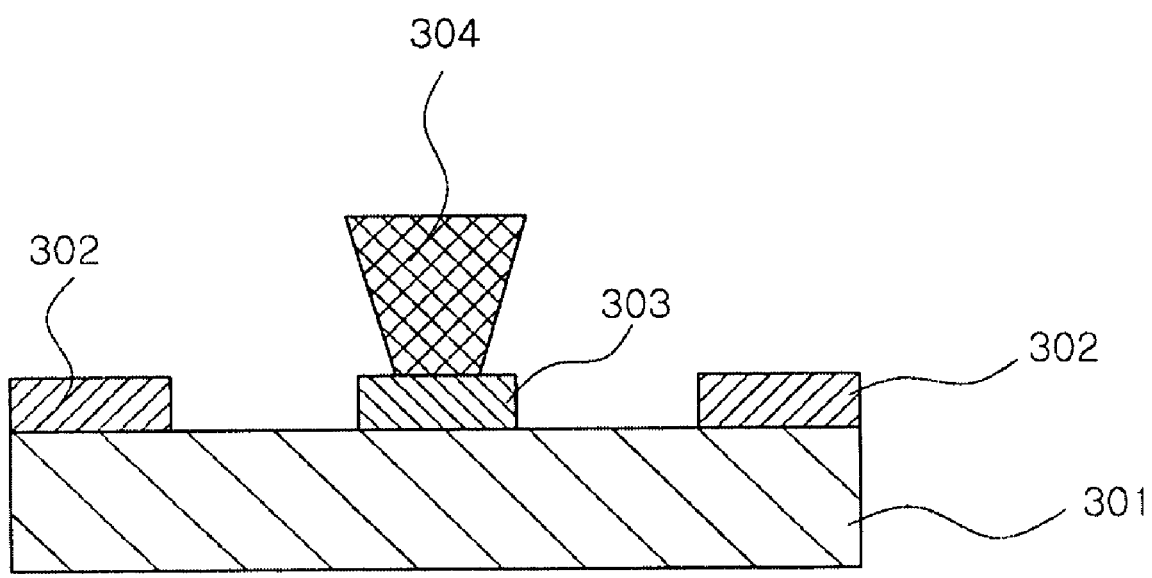
Figure 3F:
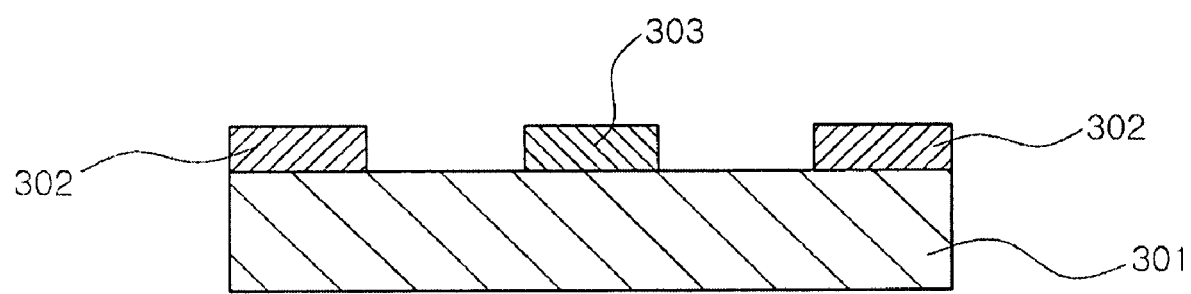
Figure 3G:
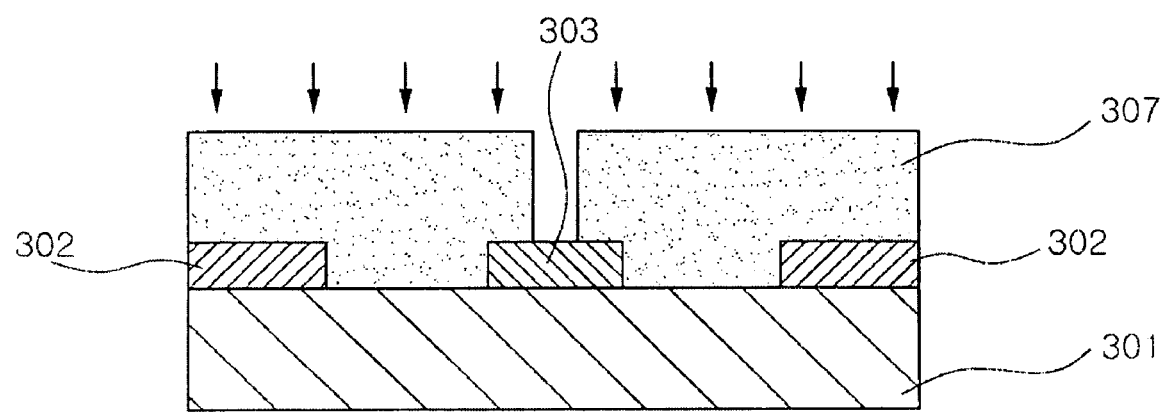
Figure 3H:
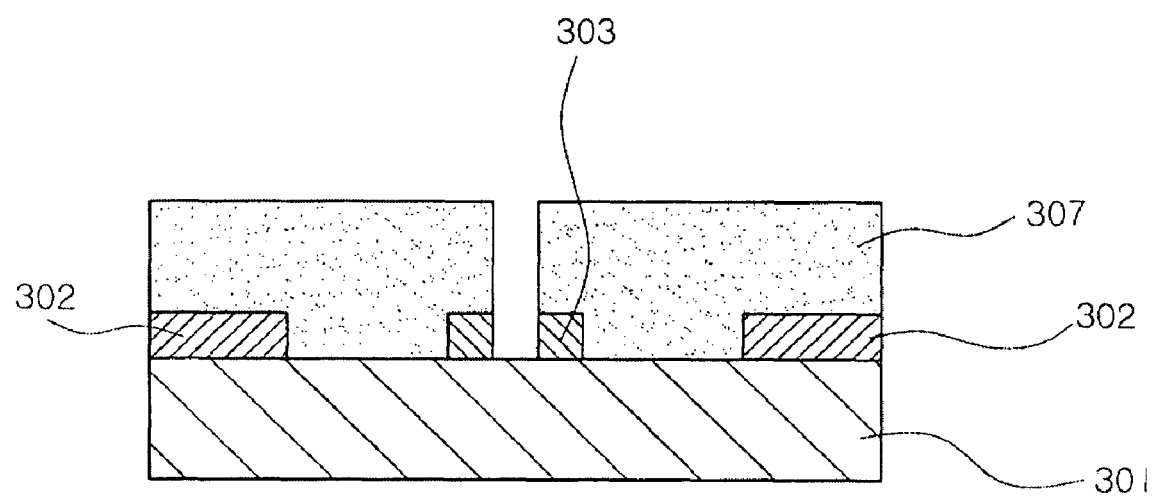
Figure 31:
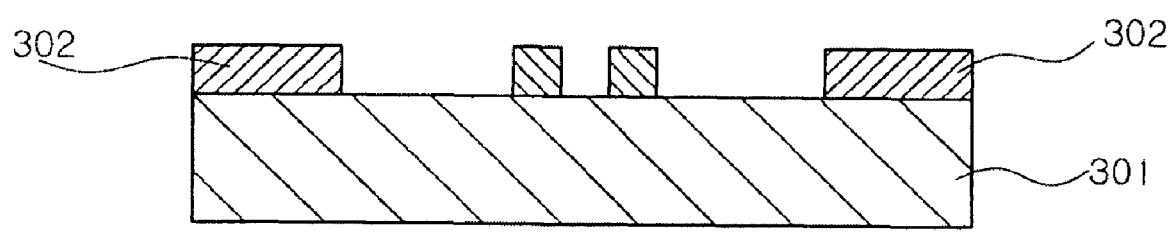
Figure 3J:
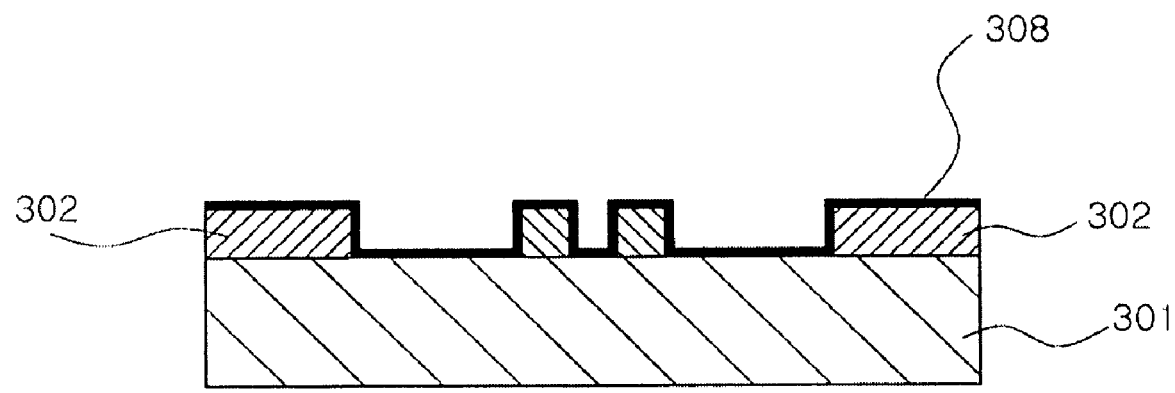
Figure 3K:
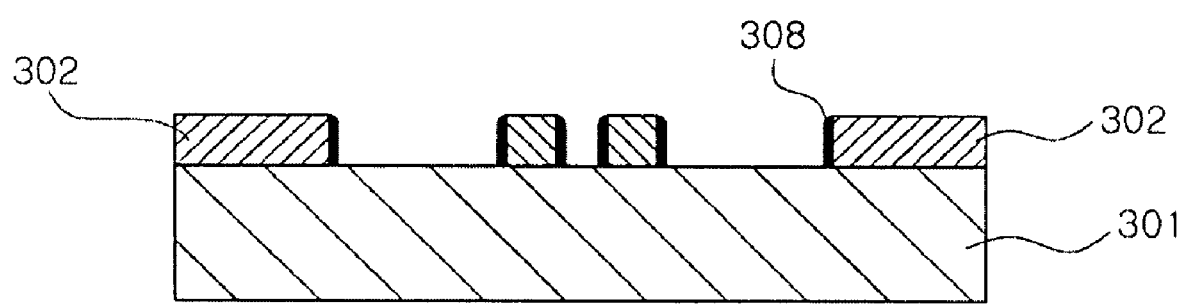
Figure 3L:
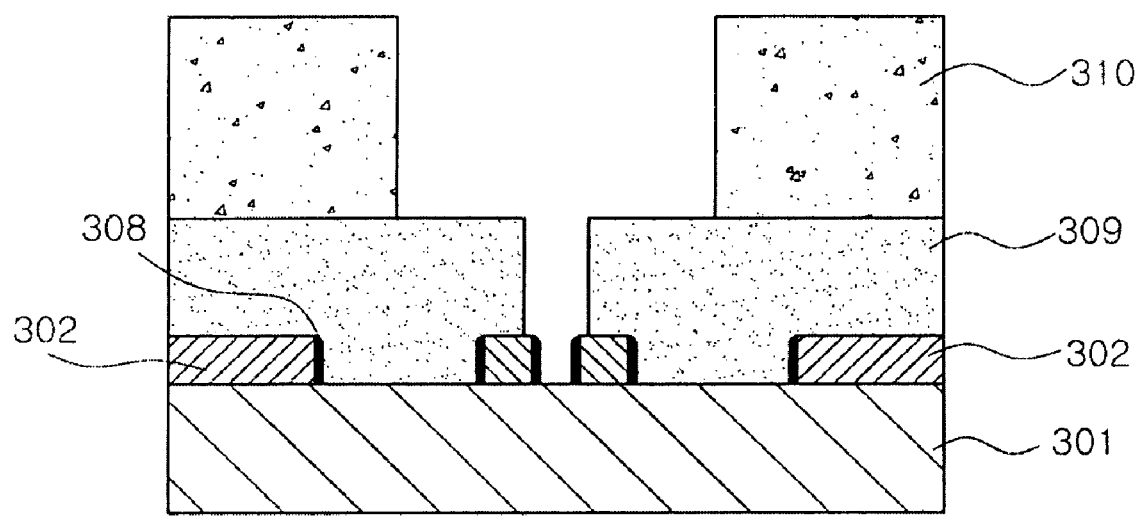
Figure 3M:
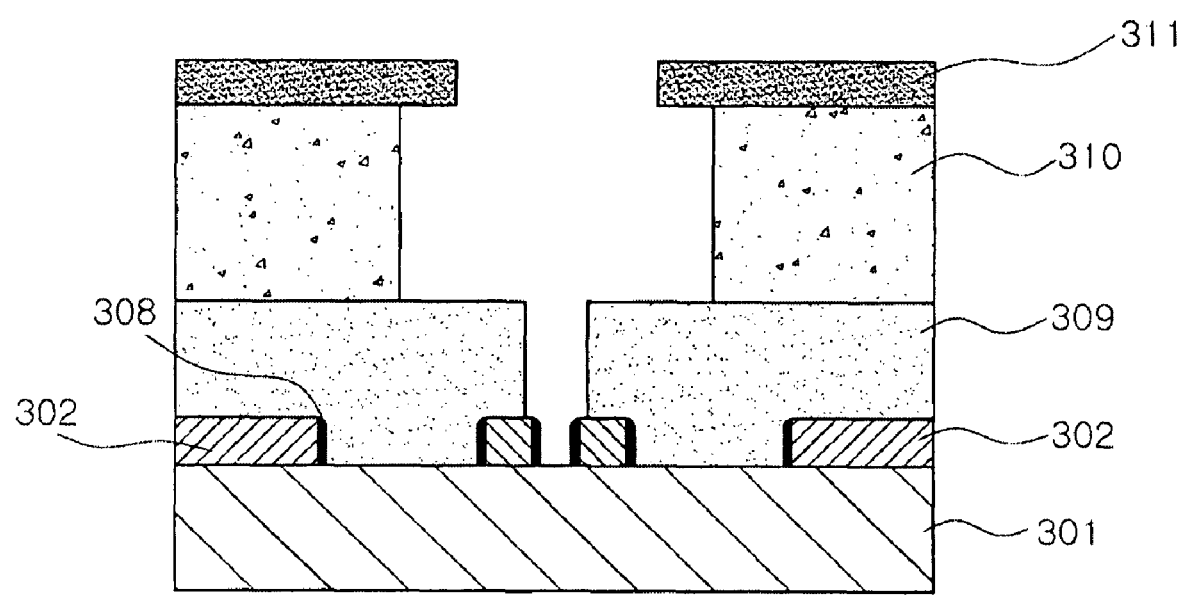
Figure 3N:
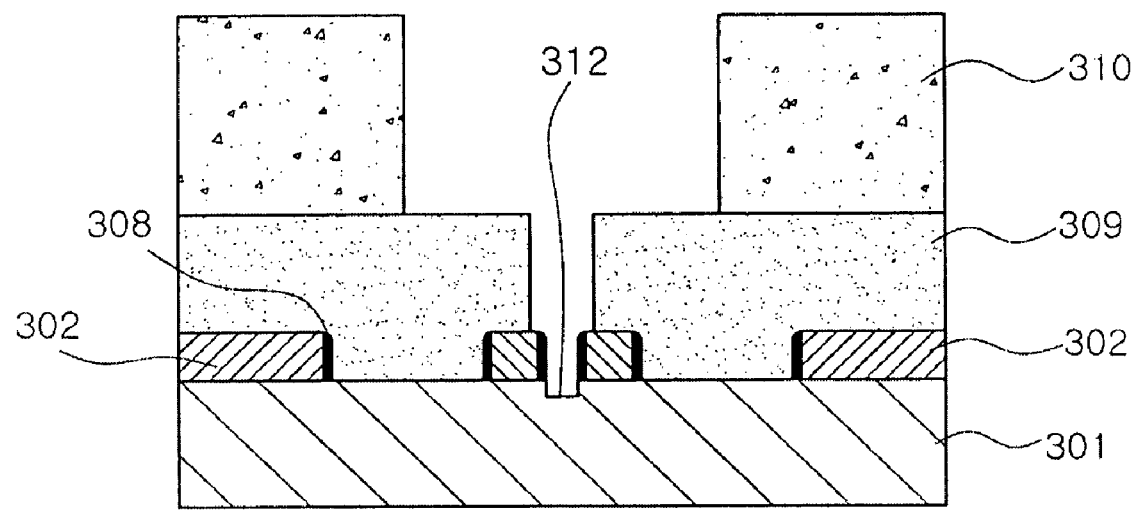
Figure 30:
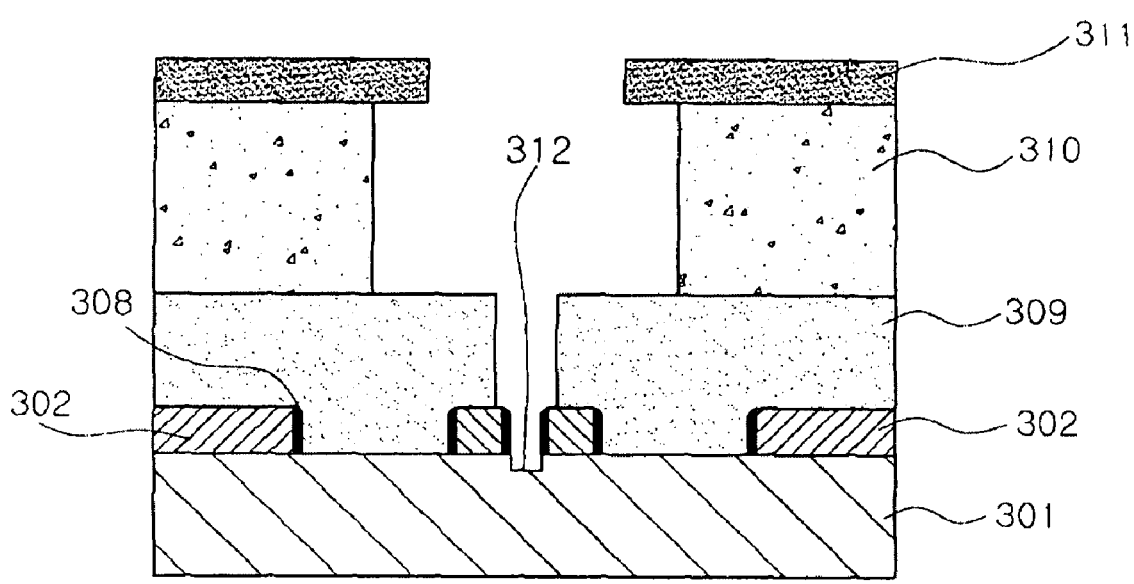
Figure 3P:
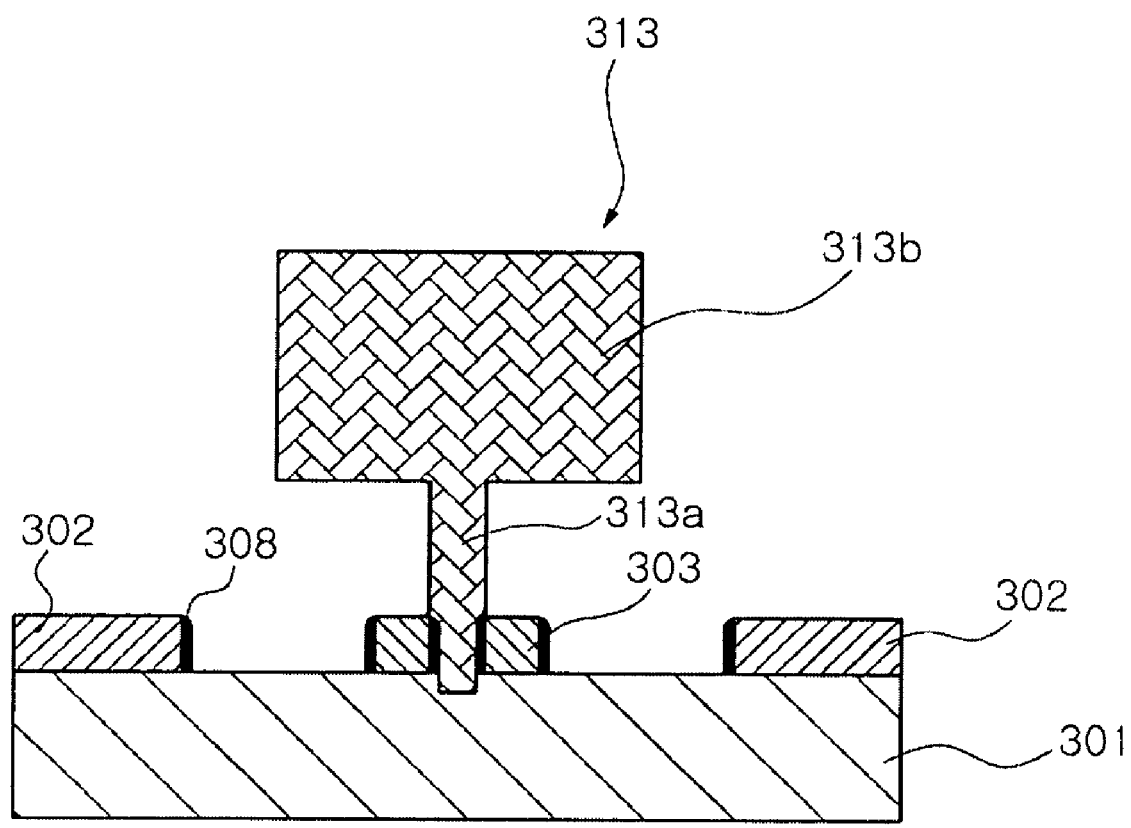

FIGS. 3A to 3P are longitudinal sectional views illustrating the process for fabricating a semiconductor device with T-gate electrode according to the second embodiment of the present invention and a structure of the semiconductor. Specifically, FIG. 3P illustrates an entire structure of the semiconductor device with the T-gate electrode according to the second embodiment.

First, the method of fabricating the semiconductor device with the T-gate electrode according to the second embodiment will be described with reference to FIGS. 3A to 3P.

First, as shown in FIG. 3A, source and drain electrodes 302 are formed on the substrate 301. This procedure may be performed in the same manner as the first embodiment. That is, the substrate 301 is epitaxially grown on a semiconductive layer. The source and drain electrodes 302 are made of a conductive metal such as an alloy obtained by processing AuGe/Ni/Au through a rapid thermal process.

As described above, when the source and drain electrodes 302 are formed, a first protective layer for protecting a supporting part of the T-gate electrode are formed on the substrate 301. Longitudinal sectional views of FIGS. 3B to 3I correspond to a process of fabricating the first protective layer.

Specifically, as shown in FIG. 3B, the first protective layer 303 with a predetermined thickness is deposited on the entire surface of the substrate 301. The first protective layer 303 may be constructed with a silicon nitride layer or silicon oxide layer. The first protective layer 303 may be deposited through the PECVD method or the sputtering method. At this time, in the second embodiment, unlike the first embodiment, the thickness of the first protective layer 303 ranges from about 300 to 500 Å.

Then, as shown in FIG. 3C, the entire surface of the first protective layer is coated with a first photosensitive layer 304 of single-layer. The first photosensitive layer 304 may be constructed with a photosensitive layer for image inversion. In this case, the first photosensitive layer 304 is baked and exposed to light by using a mask 305 with a first line width (for example, a line width ranging from 0.8 to 1.2 µm). As shown in FIG. 3D, the first protective layer 303 is exposed by removing a part of the first photosensitive layer 304 which is protected by the mask 305 when the first photosensitive layer 304 is exposed by performing the image inversion baking, the entire surface exposure, and the photolithography after the exposing the first photosensitive layer 304 to light. Accordingly, a part of the first photosensitive layer 304 exposed to light remains. The first photosensitive layer 304 has a thickness ranging from about 1.1 to 1.2 µm and a line width ranging from about 0.8 to 1.2 µm. Ultraviolet rays (I-line, 365 nm) are used as a light source. Here, temperature and time of the image inversion baking are 113° C. and 3 minutes, respectively.

As shown in FIG. 3E, the substrate 301 is exposed by anisotropically etching the first protective layer 303 by using the remaining first photosensitive layer 304 as an etching mask. Here, a dry etching method such as a reactive ion etching method may be used as the etching method. At this time, the first protective layer 303 that is not protected by the first photosensitive layer 304 may be over-etched so as not to remain.

As shown in FIG. 3F, the first photosensitive layer 304 is completely removed. Here, the plasma ashing process may be performed so that the first photosensitive layer 304 may not remain.

As shown in FIG. 3G, the entire surface of the substrate 301 is coated with a second photosensitive layer 307 of single-layer, baked, irradiated with an electron beam by using a mask pattern, and photo lithographed, so that the first protective layer 303 is exposed with a second line width (about 0.1 µm). At this time, the second photosensitive layer 307 may be made of PMMA and have a thickness about 2500 Å.

As shown in FIG. 3H, the first protective layer 303 that is exposed with the second line width is anisotropically etched by performing the dry etching method using the reactive ion etching method by using the second photosensitive layer 307 as the etching mask. The substrate 301 corresponding to the etched part is exposed. At this time, the first protective layer 303 may be over-etched so as not to remain on the substrate 301. However, it is required not to damage a substrate channel layer.

As shown in FIG. 3I, the second photosensitive layer 307 is completely removed. At this time, the plasma ashing process may be performed so that the second photosensitive layer 307 may not remain.

Accordingly, the first protective layer 303 has a shape of two columns facing each other with a second line width.

A second protective layer is formed on sides of the first protective layer 303 and sides of the source and drain electrodes 302.

Specifically, as shown in FIG. 3J, a second protective layer 308 is deposited on the entire surface of the substrate 301 with a thickness ranging from about 100 to 200 Å. Here, the second protective layer 308 may be constructed with a silicon nitride layer or silicon oxide layer. The second protective layer 308 may be deposited through the PECVD method or the sputtering method. As shown in FIG. 3K, the second protective layer 308, which is deposited on the upper surface of the substrate 301, the source and drain electrodes 302, and the first protective layer 303, is removed by anisotropically etching the second protective layer 208 by using the dry etching method such as the reactive ion etching method. At this time, the second protective layer on the substrate 301 that is located between the two columns of the first protective layer 303 is over-etched so that the second protective layer 303 may not remain on the substrate 301.

As described above, when the second protective layer 303 is formed completely, the T-gate electrode is formed by using a double-layered or triple-layered photosensitive layer.

Specifically, as shown in FIGS. 3L and 3M, the surface of the substrate 301 is coated with third and fourth photosensitive layers 309 and 310 which correspond to a double-layered photosensitive layer or third to fifth photosensitive layers 309 to 311 which correspond to a triple-layered photosensitive layer. At this time, a third photosensitive layer 309 that is the lowest layer in the double-layered structure or triple-layered structure is used to form a supporting part of the T-gate electrode. The third photosensitive layer 309 has a thickness corresponding to a height of the supporting part. A fourth photosensitive layer 310 formed on the third photosensitive layer 309 is used to form a head part of the T-gate electrode. The fourth photosensitive layer 310 has a thickness corresponding to a height of the head part. A fifth photosensitive layer 311 that is the third layer in the triple-layered structure enables the lift-off process to be easily performed. The fifth photosensitive layer 311 has an arbitrary thickness. For example, the third to fifth photosensitive layers 309 to 311 have thicknesses of about 2500 Å, 10000 Å, and 1400 Å, respectively. For example, the third and fifth photosensitive layers 309 and 311 are made of a PMMA material. The fourth photosensitive layer 310 is made of a co-polymer material.

As described above, when the third and fourth photosensitive layers 309 and 310 or the third to fifth photosensitive layers 309 to 311 are formed, a part of the third and fourth layers 309 and 310 or the third to fifth photosensitive layers 309 to 311 in which the supporting part and the head part are to be formed is removed by performing a baking, an electron beam irradiation, and a photolithography. At this time, in the third photosensitive layer 309, a part of the supporting part that is not protected by the first and second protective layers 303 and 308 has a line width, for example, a line width of 0.3 µm, which is greater than a fine line width of the first and second protective layers 303 and 308. It is for reducing a gate resistance by increasing the cross section of the gate electrode.

As shown in FIGS. 3N and 3O, the substrate 301 that is exposed by using a dry etching method using inductively coupled plasma is recess-etched. At this time, $BCl_3/SF_6$ is a gas used for the dry etching method of substrate 301 so that only the substrate 301 may be etched. Accordingly, the substrate 301 is etched with a line width of 0.1 µm along a fine line width 312 between two columns of the first protective layer 308. The recess-etching of the substrate enables a desired current to flow between the source and the drain, thereby adjusting the current.

As shown in FIG. 3P, a T-gate electrode 313 is formed by depositing a metal for the gate electrode which is Ti/Pt/Au through the vacuum electron beam deposition method and removing the double-layered or triple-layered photosensitive layer through the lift-off process. The total thickness of the metal for the electrode may range from about 6000 to 7000 Å. The structure of the semiconductor device with the T-gate according to the second embodiment of the present invention will be described with reference to FIG. 3P.

Referring to FIG. 3P, the semiconductor device with the T-gate according to the second embodiment of the present invention includes the substrate 301, the source and drain electrodes 302 formed on the substrate 301, the T-gate electrode 313 constructed with the supporting part 313a contacting the substrate 301 and the head part 313b with a predetermined cross section which is integrated into the supporting part 313a, the first protective layer 303 made of an insulating material which is formed on lower sides of the supporting part 313a of the T-gate electrode 313, and the second protective layer 308 made of an insulating material which is formed on sides of the source and drain electrodes 302 and sides of the first protective layer 303.

Parasitic capacitance between the T-gate electrode 313 and the source and drain electrodes 302 is decreased due to the first and second protective layers 303 and 308. It is possible to obtain a stable frequency characteristic and a stable operational characteristic due to reduction of the gate length.

Figure 4:
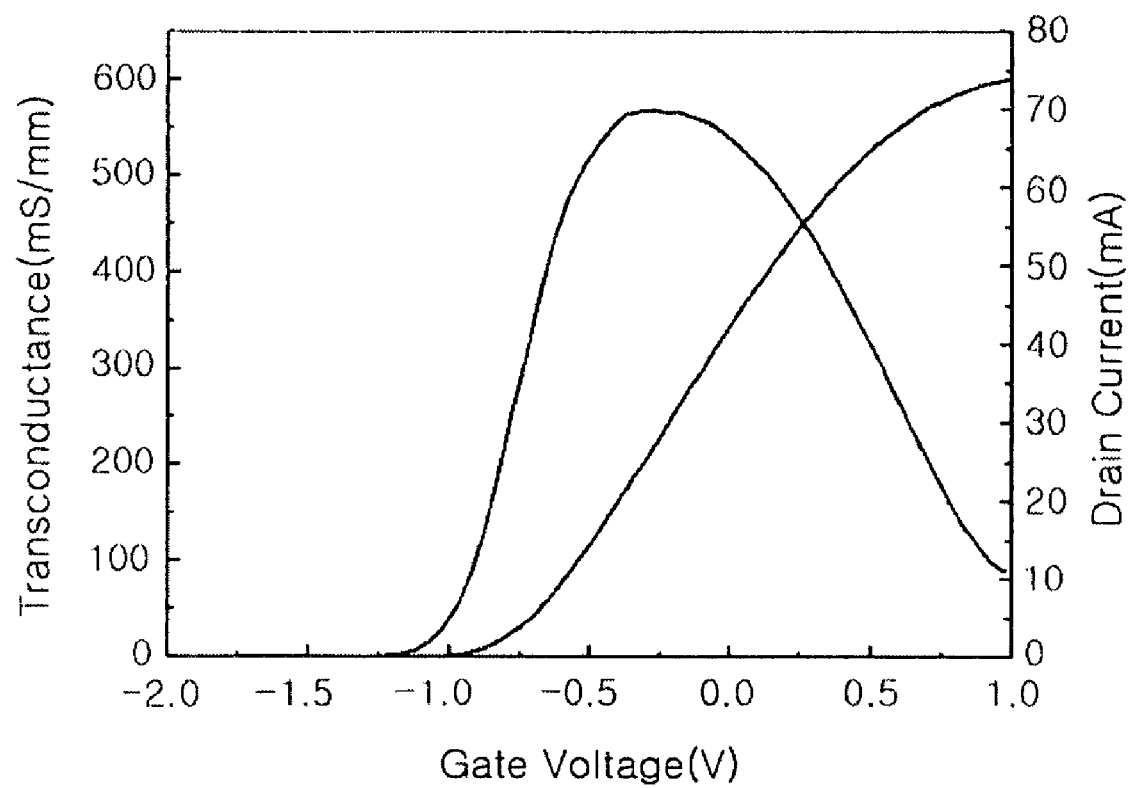
FIG. 4 is a graph of a transconductance Gm and a drain current Ids with respect to a gate voltage in a case where a drain voltage of a semiconductor device with a T-gate electrode according to an embodiment of the present invention is 1.5 V.

FIG. 4 is a graph of a transconductance Gm and a drain current Ids with respect to a gate voltage in a case where a drain voltage of a semiconductor device with a T-gate electrode according to an embodiment of the present invention is 1.5 V. Referring to the graph of FIG. 4, as the gate voltage increases, the drain current increases. When the gate voltage is −0.225 V, the transconductance Gm is the maximum value of 570 mS/mm.

Figure 5:
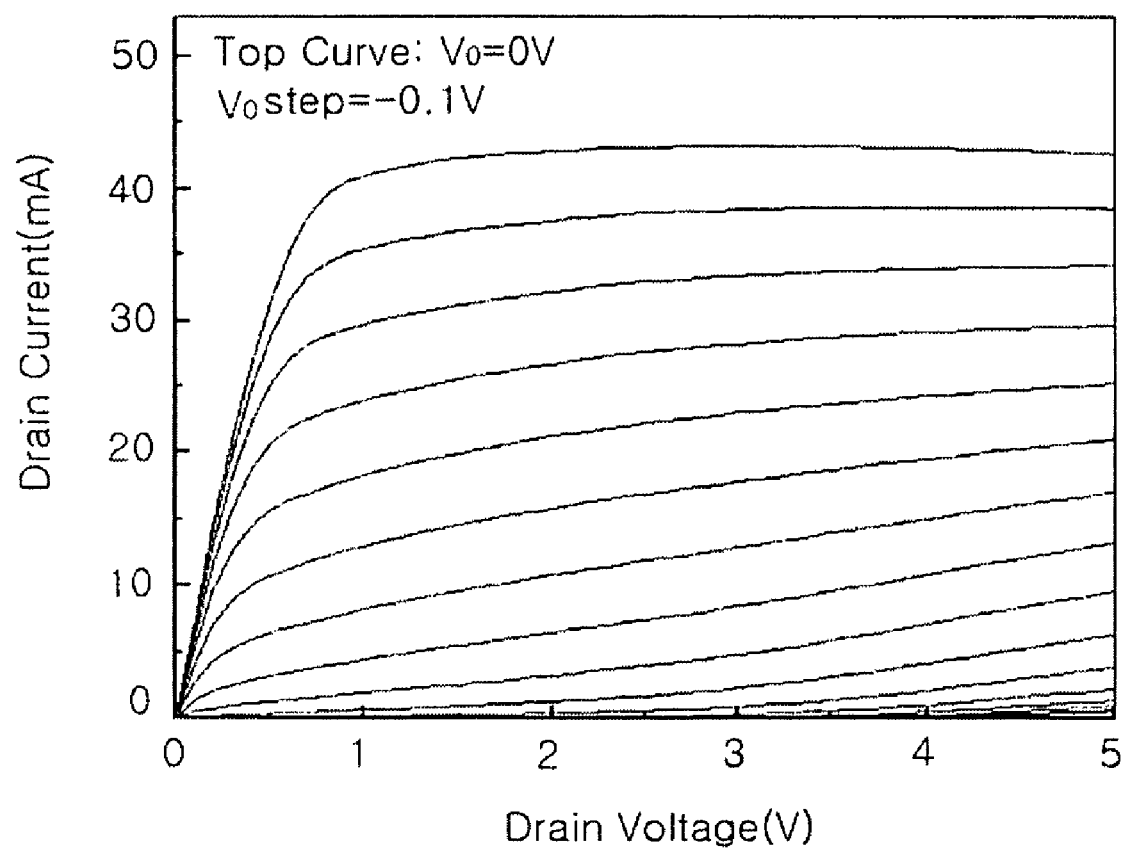
FIG. 5 is a graph of a drain current with respect to a drain voltage of a semiconductor device with a T-gate electrode according to an embodiment of the present invention.

FIG. 5 is a graph of a drain current with respect to a drain voltage of a semiconductor device with a T-gate electrode according to an embodiment of the present invention. Referring to FIG. 5, a measured pinch-off voltage Vp of the semiconductor device according to the embodiment is −1.05 V. When a gate voltage is 0 V and when a drain voltage is 5 V, measured drain current density is about 430 mA/mm.

Figure 6:
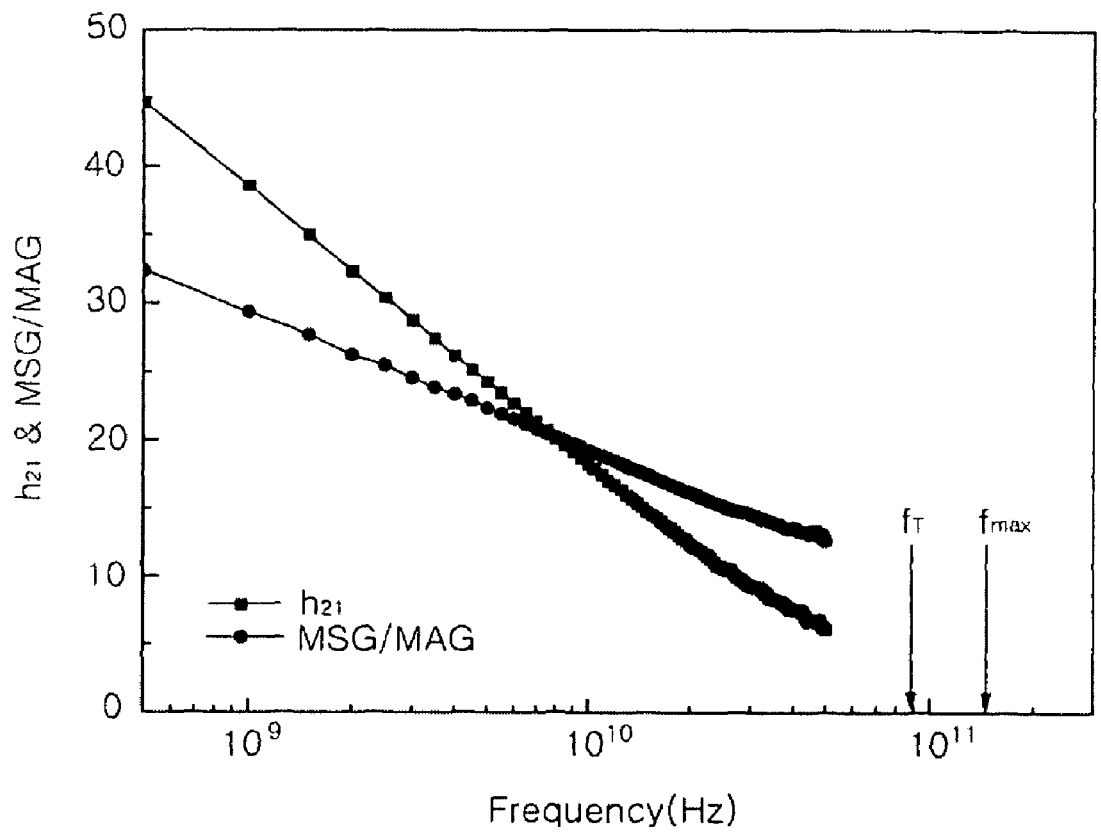
FIG. 6 is a graph illustrating a high frequency characteristic of a semiconductor device with a T-gate electrode according to an embodiment of the present invention.

In addition, FIG. 6 is a graph illustrating a high frequency characteristic of a semiconductor device with a T-gate electrode according to an embodiment of the present invention. Referring to FIG. 6, in the semiconductor device according to the embodiment, when a drain voltage is 1.5 V and a gate voltage is 0 V, a cutoff-frequency $f_T$ and the maximum resonance frequency $f_{max}$ of the semiconductor device are 90 GHz and 228 GHz, respectively.

Accordingly, the semiconductor device with the T-gate electrode according to the present invention has a stable high-frequency wave characteristic and a stable high-speed characteristic. The semiconductor device may be applied to high-frequency electronic devices.

As described above, it is possible to improve stability of the gate electrode by using a protective layer constructed with a silicon nitride layer or silicon oxide layer and to maintain a fine line width of the gate by etching the silicon nitride layer through the dry etching method.

In addition, it is possible to improve an output characteristic of a drain of the semiconductor device by reducing gate-source capacitance and gate-drain capacitance by using a structure in which the protective layer remains on sides of the supporting part located under the head part of the T-gate electrode. It is also possible to improve a cutoff-frequency and improve a high-frequency characteristic due to reduction of the gate length.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor device comprising:
a substrate;
source and drain electrodes formed on the substrate;
a T-gate electrode constructed with a supporting part contacting the substrate and a head part having a predetermined cross section which is integrated into the supporting part, the T-gate electrode formed on the substrate;
a first protective layer made of an insulating material which is formed on each of first and second sides of the supporting part of the T-gate electrode; and
a second protective layer made of an insulating material which is formed on sides of the source and drain electrodes and sides of the first protective layer;
wherein the sides of the first protective layer include a first side, and a second side opposite the first side and facing the supporting part, and wherein the second protective layer has a first portion on the side of the source electrode, a second portion on the side of the drain electrode and respective third portions on the first and second sides of the first protective layer.

2. The semiconductor device of claim 1, wherein the first protective layer is formed on the entire sides of the supporting part of the T-gate electrode.

3. The semiconductor device of claim 1, wherein the first protective layer is formed only on a lower part of the supporting part.

4. The semiconductor device of claim 1, wherein the substrate is constructed with a semiconductive gallium arsenide (GaAs) layer and an epitaxially grown layer that is grown on the GaAs layer.

5. The semiconductor device of claim 1, wherein the first and second protective layers are silicon nitride layers.

6. The semiconductor device of claim 1, wherein the first and second protective layers are silicon oxide layers.

7. The semiconductor device of claim 2, wherein the first protective layer has a thickness ranging from 2000 to 3500 Å.

8. The semiconductor device of claim 3, wherein the first protective layer has a thickness ranging from 300 to 600 Å.

9. The semiconductor device of claim 1, wherein the second protective layer has a thickness ranging from 100 to 250 Å.

10. A semiconductor device comprising:
a substrate;
source and drain electrodes formed on the substrate;
a T-gate electrode constructed with a supporting part contacting the substrate and a head part having a predetermined cross section integrated into the supporting part, the T-gate electrode formed on the substrate, the supporting part having opposite first and second sides;
a first protective layer made of an insulating material formed on each of the first and second sides of the supporting part; and
a second protective layer made of an insulating material formed on a side of the source electrode, a side of the drain electrode and sides of the first protective layer;
wherein the sides of the first protective layer include a first side, and a second side opposite the first side and facing the supporting part, and wherein the second protective layer has a first portion on the side of the source electrode, a second portion on the side of the drain electrode and respective third portions on the first and second sides of the first protective layer.

11. A semiconductor device according to claim 10, further comprising a passivation layer, wherein the first and second portions of the second protective layer are separated from the third portion of the second protective layer on the first side of the first protective layer.

12. The semiconductor device of claim 10, wherein the third portions on the first and second sides of the first protective layer are in direct contact with each of the first and second sides of the supporting part.

13. The semiconductor device of claim 10, wherein the first protective layer is formed on the entirety of each of the first and second sides of the supporting part of the T-gate electrode.

14. The semiconductor device of claim 13, wherein the first protective layer has a thickness ranging from 2000 to 3500 Å.

15. The semiconductor device of claim 10, wherein the first protective layer is formed on the entirety of each of the opposite sides of the supporting part of the T-gate electrode.

16. The semiconductor device of claim 10, wherein the first protective layer is formed only on a lower part of each of the opposite sides of the supporting part of the T-gate electrode.

17. The semiconductor device of claim 10, wherein the substrate is constructed with a semiconductive gallium arsenide (GaAs) layer and an epitaxially grown layer that is grown on the GaAs layer.

18. The semiconductor device of claim 10, wherein the first and second protective layers are silicon nitride layers.

19. The semiconductor device of claim 10, wherein the first and second protective layers are silicon oxide layers.

20. The semiconductor device of claim 10, wherein the second protective layer is in direct contact with the side of the source electrode, the side of the drain electrode, and the sides of the first protective layer.

* * * * *